United States Patent [19]

Suzuki et al.

[11] 4,020,399

[45] Apr. 26, 1977

[54] VAPOR COOLING DEVICE FOR DISSIPATING HEAT OF SEMICONDUCTOR ELEMENTS

[75] Inventors: Toshio Suzuki; Yoshiro Shikano, both of Amagasaki, Japan

[73] Assignee: Mitsubishi Denki Kabushiki Kaisha, Tokyo, Japan

[22] Filed: Mar. 12, 1975

[21] Appl. No.: 557,892

[30] Foreign Application Priority Data

Mar. 15, 1974   Japan .................. 49-30410

[52] U.S. Cl. .................. 361/331; 357/82; 165/80; 174/15 R; 165/105

[51] Int. Cl.² .................. H01L 23/34

[58] Field of Search .................. 321/8 C; 174/15 R; 165/80, 105, DIG. 3; 317/100; 357/82, 83

[56] References Cited

UNITED STATES PATENTS

| 3,609,991 | 10/1971 | Chu | 317/100 |
|---|---|---|---|
| 3,653,433 | 4/1972 | Scharli | 165/105 |
| 3,834,454 | 9/1974 | Gammel | 165/80 |
| 3,864,607 | 2/1975 | Phillips | 317/100 |

FOREIGN PATENTS OR APPLICATIONS 791,491   3/1958   United Kingdom .......... 165/DIG. 3

Primary Examiner—Gerald P. Tolin
Attorney, Agent, or Firm—Wenderoth, Lind & Ponack

[57] ABSTRACT

A plurality of semiconductor elements alternating with hollow heat dissipation blocks are connected together into a unitary structure by means of a fastening mechanism and disposed below a coolant reservoir. The hollow blocks are connected in fluid communication to the reservoir through individual connection tubes including respective bellows-shaped tube portions. A body of boilable liquid coolant is charged into the reservoir and fills both the connection tubes and hollow heat dissipation blocks. A condenser is disposed in fluid communication relationship with and above the reservoir. The condenser may be disposed within the reservoir.

6 Claims, 4 Drawing Figures

… … …

VAPOR COOLING DEVICE FOR DISSIPATING HEAT OF SEMICONDUCTOR ELEMENTS

BACKGROUND OF THE INVENTION

This invention relates to a vapor cooling device for cooling an electric device such as a semiconductor device through the utilization of the phase change of a condensible coolant, for example, FREON (trade mark).

It is well known that vapor cooling systems utilizing the heat transfer due to the boiling of a condensible coolant such as FREON (trade mark) exibit extraordinarily excellent cooling characteristics as compared with cooling systems previously employed for electric devices. Recently there have been developed cooling devices for cooling electric devices through the utilization of the heat transfer which have excellent cooling characteristics.

In vapor cooling devices previously developed for cooling semiconductor devices, the stack of semiconductor elements and alternating heat dissipation blocks has been immersed in a body of condensible coolant in the form of its liquid phase charged into a container forming a closed coolant loop with the associated condenser. Thus it has been required to electrically connect the stack to an external electric device through electrically insulated terminals extending through and sealed in the wall of the container. In order to ensure a closed coolant loop, the insulated terminals must have have good reliability. Also in high capacity rectifiers, the stack should fulfil the requirements for the current rating and voltage withstanding property corresponding to the ratings thereof. For example, the stack should have a current rating of several thousands of amperes and withstand a voltage of several thousands of volts.

Further upon any one of the semiconductor elements and/or its accessories being damaged so that they or it must be replaced by new ones or one respectively, it has been required to break the closed coolant loop followed by the replacement. Since the closed coolant loop including the container and condenser is required to be well sealed, the same has included seal welds. Thus a cutting machine has been inevitably used to break the container. Also the removal of the coolant from the container has been attended with difficulties.

Accordingly it is an object of the present invention to provide a new and improved vapor cooling device for an electric device having an excellent performance in which the disadvantages and difficulties of the prior art systems as above described are eliminated.

It is another object of the present invention to provide an improved vapor cooling device most suitable for cooling a planar semiconductor element or elements.

SUMMARY OF THE INVENTION

According to the principles of the present invention there is provided a vapor cooling device for cooling an electric device comprising a coolant reservoir having a body of a condensible coolant in the form of a liquid phase charged therein, at least one heat generation element disposed below the coolant reservoir and two heat dissipation blocks abutting against opposite sides of the one or each heat generation element. The heat generation element or elements and the heat dissipation blocks are connected together into a unitary structure by means of a fastening mechanism. The heat dissipation blocks include therein respective hollow spaces connected to the interior of the coolant reservoir through individual connection tubes. The condensible coolant in the form of its liquid phase fills the individual tubes and the hollow spaces in the heat dissipation blocks and the one or each heat generation element generates heat sufficient to boil those portions of the liquid coolant disposed within the hollow spaces in the adjacent heat dissipation blocks into its vapor phase. The vapor phase of the coolant is moved upwardly through the associated connection tubes to enter the coolant reservoir after which it passes to condenser means disposed above the coolant reservoir. Within the condenser means the vapor phase of the condensible coolant is condensed into its liquid phase. Then the liquid phase of the coolant is returned to the coolant reservoir.

BRIEF DESCRIPTION OF THE DRAWINGS

The present invention will become more readily apparent from the following detailed description taken in conjunction with the accompanying drawings in which.

DESCRIPTION OF THE PREFERRED EMBODIMENTS

Figure 1:
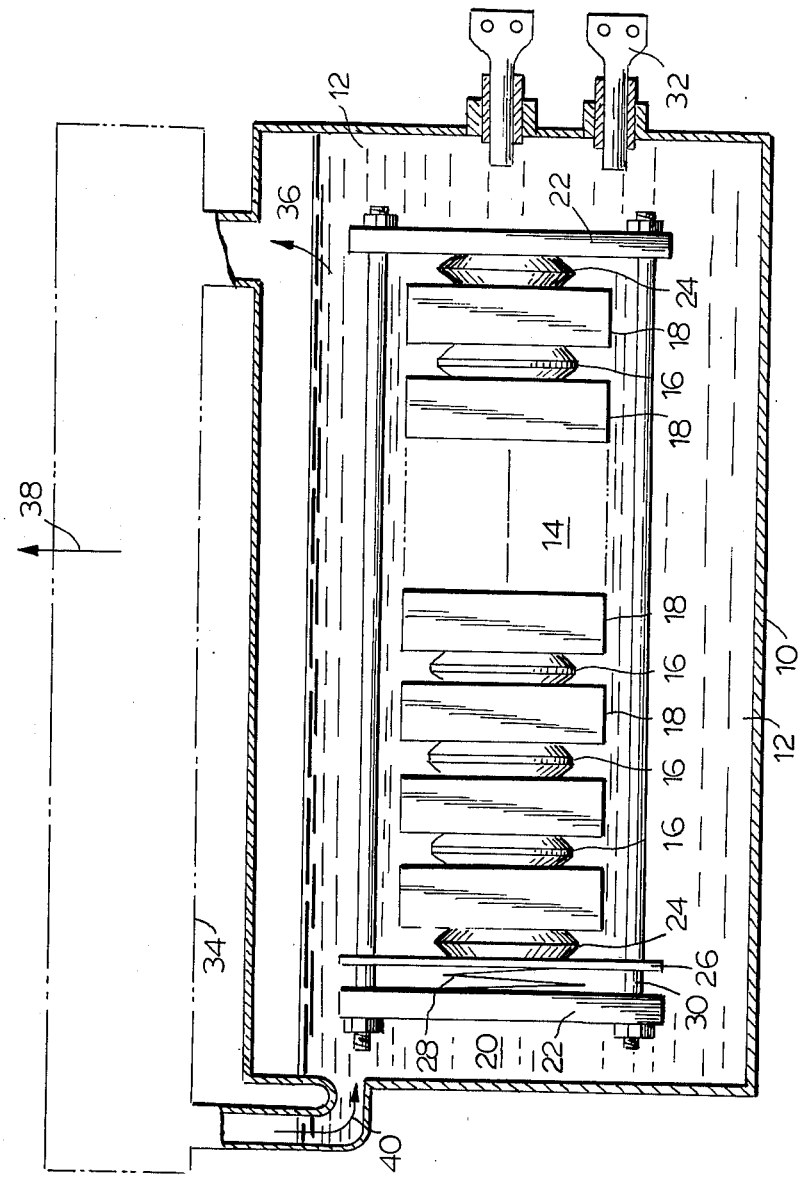
FIG. 1 is a fragmental sectional view of a conventional device for vapor cooling a semiconductor device, with parts illustrated in elevation.

Referring now to the drawings and FIG. 1 in particular, there is illustrated a conventional device for cooling a semiconductor device by utilizing the vapor cooling system. The arrangement illustrated comprises a cooling container 10, a body of condensable coolant 12 such as FREON (trade mark) in the form of a liquid phase charged into the container 10 to leave a space in the upper portion of the container, and a rectifier stack immersed in the liquid coolant 12. The rectifier stack is generally designated by the reference numeral 14 and include a plurality of planar semiconductor elements 16 alternating with heat dissipation blocks 18 in the form of flat plates, and a fastening mechanism generally designated by the reference numeral 20 to maintain the semiconductor elements 12 and the heat dissipation blocks 18 in tight contact relationship. The fastening mechanism 20 includes a pair of opposite fastening plates 22 between which are the semiconductor elements 16 alternating with the heat dissipation block 18, and a pair of electrically insulating seats 24 disposed on the outermost heat dissipation blocks 18. One of the insulating seats 24, in this case, the righthand seat 24 as viewed in FIG. 1 abuts against the righthand fastening plate 22 and the other or lefthand insulating seat 24 abuts against a retaining plate 26 having a compression spring 28 interposed between the same and the lefthand fastening plate 24. A plurality of bolts 30 are threaded into the fastening and retaining plates 22 and 26 respectively and fastened to both fastening plates 22 by means of nuts thereby to resiliently maintain the semiconductor elements 16 and the heat dissipation blocks 18 in place between the pair of fastening plates 22.

The rectifier stack 14 is electrically connected to a utilization device (not shown) through terminals 32 extending through and sealed in electrically insulating relationship in one side wall, in this case, the righthand side wall of the container 10.

The container 10 is connected in fluid communication with a condenser shown in phantom lines 34 and located above the container 10 through a pair of ducts as shown in FIG. 1. Thus the container 10 and the condenser 34 form a closed coolant loop.

In operation, the liquid coolant 12 boils so as to be converted to its vapor phase 36. The vapor phase 36 enters the condenser 34 through one of the ducts as shown by the arrow labelled 36 in FIG. 1. Within the condenser 34 the vapor phase 36 is condensed by a secondary coolant 38. The resulting condensate 40 is returned to the container 10 wherein it again serves to take up heat by boiling.

Conventional vapor cooling devices such as shown in FIG. 1 are disadvantageous in the following respects: Since the rectifier stack is disposed in the container, it is required to extend electrically insulated terminals through the wall of the container and seal them therein in order to electrically connect the semiconductor elements to the external electrical device. Because the container is disposed in the closed coolant loop, the insulated terminals 32 must necessarily have high reliability. Also for handling large current, the semiconductor elements should have a current rating and voltage withstanding ability suitable for such purposes. For example, the current rating should be several thousands of amperes and a voltage as high as several thousands of volts should necessarily be withstood by the semiconductor elements.

Further semiconductor elements and/or their accessories may be disabled resulting in the necessity of replacement. The replacement must be accomplished after the closed coolant loop has been broken. In that event a cutting machine must be used to break the container, because the closed coolant loop including the cooling container and the condenser section generally includes sealing welds in order to maintain the closed loop tightly sealed. In addition, the removal of the coolant from the container is also attended with the difficulties.

The present invention contemplates to solve the problems as above described.

Figure 2:
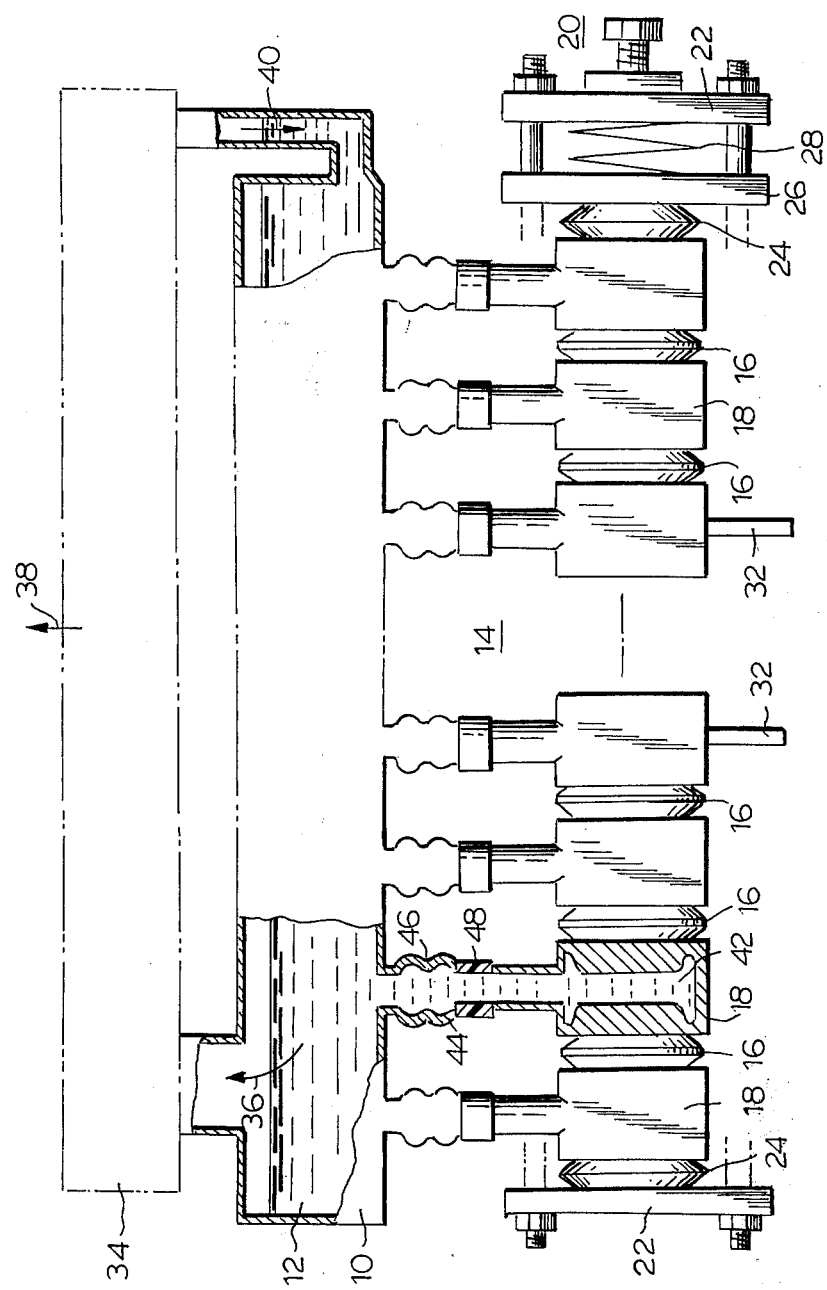
FIG. 2 is a fragmental side elevational view of a vapor cooling device for cooling a semiconductor device constructed in accordance with the principles of the present invention with parts cut away.

Referring now to FIG. 2 wherein like reference numerals designate components identical or similar to those shown in FIG. 1, there is illustrated a vapor cooling device for cooling a semiconductor device including a plurality of planar semiconductor elements in accordance with the principles of the present invention. The arrangement illustrated is different from that shown in FIG. 1 principally in that in FIG. 2 the rectifier stack 14 is disposed externally of and below a coolant reservoir 10 shallower than the cooling container 10 as shown in FIG. 1. Each of the heat dissipation blocks 18 includes a hollow space 42 therein and a plurality of connection tubes 44 extend downwardly from the bottom of the coolant reservoir 10 and are connected in fluid communication with different ones of the hollow spaces 42 in the heat dissipation blocks 18. Each of the connection tubes 44 includes a flexible tube portion 46 shown as being in the form of a bellows connected directly to the interior of the coolant reservoir 10, and an electrically insulating tube portion 48 connected at one end to the associated flexible tube portion 46 and at the other end to the hollow space 42 within the associated heat dissipation block 18. Thus the condensible liquid coolant 12 normally fills the hollow spaces 42 in the both the connection tubes 44 and heat dissipation blocks 18. A selected pair of the heat dissipation blocks 18 electrically insulated from each other are connected to respective terminals 32.

Further the compression spring 28 and the retaining plate 26 therefor are disposed in the righthand portion as viewed in FIG. 2 of the fastening mechanism 20 rather than in the lefthand portion thereof.

In operation, the semiconductor elements 16 generate heat sufficient to boil those portions of the liquid coolant 12 disposed within the hollow spaces 42 in the mating heat dissipation blocks 18 into the vapor phase. The vapor phase of the coolant is moved upwardly through the respective connection tubes 44 to enter the coolant reservoir 10. Then the vapor phase from all the heat dissipation blocks 18 passes into the condenser 34 disposed above the reservoir 10 through one of the ducts as shown by the arrows 36 in FIG. 2. Within the condenser 34 the vapor phase of the coolant is condensed into the liquid phase thereof by a stream of a secondary coolant 38 such as air. Thereafter the liquid phase of the coolant 40 is returned to the coolant reservoir 10 through the other or righthand duct as shown in FIG. 2, and then will enter the interior of the heat dissipation blocks 18 through the individual connection tubes 44.

Figure 3A:
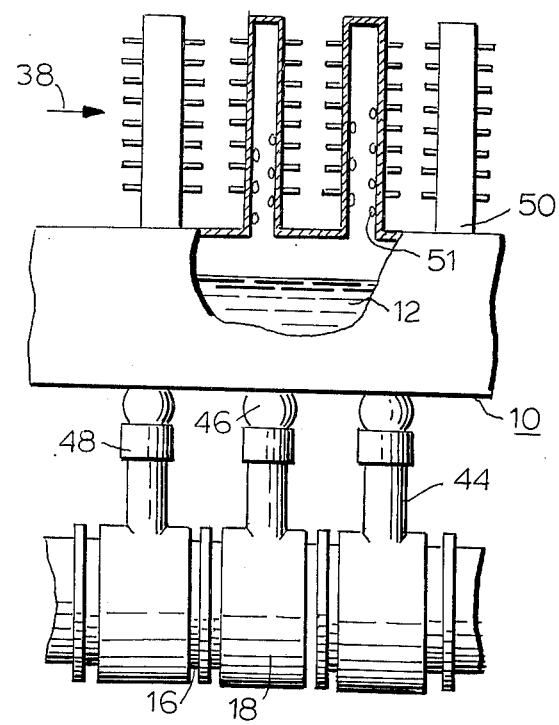
FIG. 3a is a fragmental side elevational view of a modification of the present invention with parts cut away.
Figure 3B:
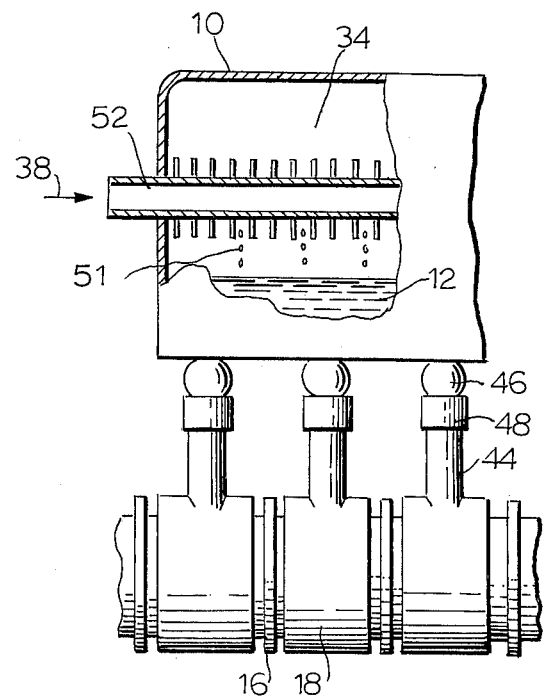
FIG. 3b is a view similar to FIG. 3a but illustrating another modification of the present invention.

FIGS. 3a and 3b wherein like reference numerals designate components identical to those shown in FIG. 2 illustrate different modifications of the present invention including the coolant reservoir and condenser 10 and 34 respectively formed into a unitary structure.

In FIG. 3a a plurality of cooling tubes 50 with heat dissipation fins extend upwardly from the upper wall of the reservoir 10 and are adapted to be cooled with air or by an air stream as shown by the arrow 38. In other respects the arrangement is substantially identical to that shown in FIG. 2.

The vapor phase of the coolant originating from the heat dissipation blocks 18 reaches the cooling tubes 50 where it is condensed into the liquid phase. Then the liquid phase of the coolant drops into the coolant reservoir 10 to again participate in removing heat from the heat dissipation blocks 18.

In FIG. 3b a single finned tube 52 is shown as extending horizontally through the upper portion of the coolant reservoir 10 and being sealed to the ends walls thereof. A secondary coolant such as oil, water, FREON (trade mark) or the like is adapted to flow through the tube 52 to condense the vapor phase of the coolant resulting from the heat dissipation blocks 18 into the liquid phase which, in turn, drops upon the liquid coolant 12 within the container 10. In other respects the arrangement is substantially identical to that shown in FIG. 2 or FIG. 3a.

The present invention has several advantages. For example, it is not required to extend the insulated terminals through the coolant reservoir and seal them therein because the rectifier stack 14 is disposed externally of the reservoir 10. Also upon the occurrence of a fault in damage to any one of the semiconductor elements and accessories, the replacement can be easily accomplished without breaking the closed coolant loop. For example, assuming that the semiconductor element next to the leftmost one as viewed in FIG. 2 has been damaged. The fastening mechanism 20 is first released to permit both heat dissipation blocks 18 abutting the damaged element 16 to be moved away from the latter because the heat dissipation blocks 18 are connected to the respective flexible tubes 46. Then the damaged element is replaced by a new semiconductor element after which the fastening mechanism is fastened in its original state as shown in FIG. 2.

While the present invention has been illustrated and described in conjunction with a few preferred embodiments thereof it is to be understood that numerous changes and modifications may resorted to without departing from the spirit and scope of the present invention. For example, the present invention is equally applicable to a single heat generation element.

What we claim is:

1. A vapor cooling device for cooling heat generator means, comprising, in combination, a coolant reservoir having a condensible coolant in the form of a liquid phase therein, at least one heat generation element disposed below said coolant reservoir, at least two heat dissipation blocks abutting against opposite sides of said heat generation element, each of said heat dissipation blocks including a hollow space therein, a fastening mechanism connecting said at least two heat dissipation blocks together into a unitary structure, a plurality of connection tubes, one for each heat dissipation block and connecting said hollow space in each of said heat dissipation blocks to said coolant reservoir, said condensible coolant in its liquid phase filling said connection tubes and said hollow spaces in said heat dissipation blocks, and condenser means disposed in fluid communication relationship with said reservoir above said coolant whereby when said heat generation element generates heat sufficient to boil these portions of said liquid coolant disposed in said hollow spaces in the adjacent heat dissipation blocks into its vapor phase, said coolant in the form of its vapor phase enter said condenser means through said connection tubes and said coolant reservoir and is condensed into its liquid phase, said condensed coolant being returned to said coolant reservoir.

2. A vapor cooling device as claimed in claim 1 wherein said heat generation element comprises a planar semiconductor element.

3. A vapor cooling device as claimed in claim 1 wherein said connection tubes each include one portion formed of a flexible tube.

4. A vapor cooling device as claimed in claim 5 wherein said condenser means is disposed within the upper portion of said coolant reservoir.

5. A vapor cooling device as claimed in claim 1 in which said condenser means is a separate condenser positioned above said coolant reservoir and having connecting tubes connecting said condenser with said coolant reservoir.

6. A vapor cooling device as claimed in claim 1 in which said condenser means is a plurality of finned tubes projecting upwardly from the top of said coolant reservoir.

* * * * *